(12) United States Patent
Schell et al.

(10) Patent No.: US 6,751,265 B1
(45) Date of Patent: Jun. 15, 2004

(54) METHOD AND SYSTEM OF AMPLITUDE MODULATION USING DUAL/SPLIT CHANNEL UNEQUAL AMPLIFICATION

(75) Inventors: Stephan V. Schell, San Francisco, CA (US); Wendell B. Sander, Los Gatos, CA (US); Earl McCune, Santa Clara, CA (US)

(73) Assignee: Tropian, Inc., Cupertino, CA (US)

( * ) Notice: Subject to any disclaimer, the term of this patent is extended or adjusted under 35 U.S.C. 154(b) by 671 days.

(21) Appl. No.: 09/661,167

(22) Filed: Sep. 13, 2000

(51) Int. Cl.[7] .............................. H03C 5/00; H03K 7/10; H03K 9/10
(52) U.S. Cl. ........................ 375/269; 375/297
(58) Field of Search ...................... 375/261, 268, 375/269, 298, 300, 302, 271, 297; 332/103, 149, 159, 155, 151, 163; 455/108, 110, 111; 330/278

(56) References Cited

U.S. PATENT DOCUMENTS

| | | | | |
|---|---|---|---|---|
| 5,454,013 A | * | 9/1995 | Minami et al. | 375/297 |
| 6,236,284 B1 | * | 5/2001 | Duello et al. | 332/149 |
| 6,285,255 B1 | * | 9/2001 | Luu et al. | 330/149 |
| 6,366,177 B1 | * | 4/2002 | McCune et al. | 332/103 |
| 6,377,784 B2 | * | 4/2002 | McCune | 455/108 |
| 6,411,655 B1 | * | 6/2002 | Holden et al. | 375/269 |

* cited by examiner

Primary Examiner—Phoung Phu
(74) Attorney, Agent, or Firm—Thelen Reid & Priest LLP

(57) ABSTRACT

A system and method of amplitude modulation is described in which first and second 180 degrees out-of-phase signals are produced and are each amplified by one of two (different amplification factor) non-linear amplifiers. One of the signals is amplified using constant amplification by a first non-linear amplifier to generate a relatively small amplified signal. The other of the signals is modulated using variable amplification by a second non-linear amplifier to generate a relatively larger amplitude modulated signal. The two resulting 180 degree out-of-phase signals are combined, such that the smaller signal effectively cancels out lower level distortion exhibited by the larger amplitude modulated signal. Alternatively, a symmetrical structure can be used for generating AM signals which include phase reversals of the carrier.

23 Claims, 14 Drawing Sheets

Signal 19A

Signal 20A

Signal 21A

Signal 22A

Signal

Signal

Signal

METHOD AND SYSTEM OF AMPLITUDE MODULATION USING DUAL/SPLIT CHANNEL UNEQUAL AMPLIFICATION

BACKGROUND OF THE INVENTION

1. Field of the Invention

The present invention relates to amplitude modulation, and in particular to amplitude modulation of phase modulated signals.

2. State of the Art

Amplitude modulation (AM) is the technique of superimposing an information signal onto a carrier signal while maintaining the same frequency and phase of the original carrier signal for transmission on a communication medium. One technique of amplitude modulation is performed by utilizing linearly phase modulated signal(s) to generate a corresponding amplitude modulation signal. According to this technique, amplitude modulation is performed by initially splitting a single RF carrier signal into two separate channel signals having a fixed angle (or phase) separation less than 180 degrees apart. The two channel signals are then phase modulated by out-of-phase modulation signals. Next, the phase modulated signals are amplified in their separate channels by non-linear power amplifiers to ensure sufficient amplification for transmitting the signal. The amplified signals are then combined to produce a single AM signal. Amplitude modulation in this system is realized by the combination/summation of the relative phase modulated channel signals which when combined create an amplitude modulation effect due to amplitude addition/subtraction of the two channel signals. In the past, this type of modulation has also been referred to as Chireix Outphasing Modulation, and LINC (linear amplification using non-linear components).

FIG. 1A shows a basic design of this type of amplitude modulation system wherein a low level RF signal 10A $\cos(\omega_c t + \phi(t))$, where $\infty \leq \phi(t) \leq \infty$, is coupled to signal processing block 10. Signal processing block 10 splits RF signal 10A into two separate signals out-of-phase from each other by a fixed amount. In addition, each of the two signals are phase-modulated with opposite phase information or modulation signals 10B (i.e., phase signals that are 180 degrees out-of-phase from each other) to generate two separate channel phase modulated RF signals 10C and 10D where signals 10C and 10D are out of phase by some amount $\theta(t)$ less than 180 degrees:

Signal 10C=A1 $\cos(\omega_c t + \phi(t) + \theta(t))$

Signal 10D=A1 $\cos(\omega_c t + \phi(t) - \theta(t))$

Each of signals 10C and 10D are then amplified by identical constant amplitude non-linear power amplifiers 11 and 12 to generate signals 11A and 12A:

$$\text{Signal 11A} = \frac{A_M}{2}\cos(\omega_c t + \phi(t) + \theta(t))$$

$$\text{Signal 11B} = \frac{A_M}{2}\cos(\omega_c t + \phi(t) - \theta(t))$$

which are then combined by the summation block 13 to generated the AM signal 13A.

The advantage/motivation of performing modulation in this manner is to improve the energy efficiency of the power amplifiers. By converting the amplitude-modulated signal into a pair of phase-modulated signals, the amplifiers no longer have to follow the amplitude modulation. With the amplifier input signal now of constant envelope, the amplifier can be operated in a non-linear manner, which is a well-known requirement for high efficiency.

For example, FIG. 1B illustrates a direct transition along a line 14 in a 16-point QAM (quadrature amplitude modulated) signal. FIG. 1C shows the phase and FIG. 1D shows the magnitude of the desired signal 14 during the transition. FIGS. 1C and 1D also show the phases of the fixed-magnitude channel signals (15 and 16) of this technique. In these figures, transition position refers to the ordinate ("y" axis) of a point on line 14 in FIG. 1B.

However, the disadvantage of this type of modulation scheme is that two equal sized power amplifiers are required to amplify each of the channel signals. The major problem with using this type of amplifier is that they tend to be relatively large components having high power requirements resulting in a substantial increase in system size and power consumption.

Also, both of power amplifiers 11 and 12 together continuously generate the transmit peak envelope power (PEP). As a result, as the output signal magnitude falls below the PEP, the difference power must be absorbed by the output combiner (block 13) as shown in FIG. 1F. In addition, to obtain the desired amplitude modulation, the phase modulation rates of the components can be significantly higher than the desired phase modulation rate, particularly at low output magnitudes.

Furthermore, some transistors, notably bipolar junction transistors (BJT), when used as power amplifiers in this type of system, have distortions in their operating characteristics at low signal magnitudes. Thus, generating low level output signals using efficient techniques such as those taught in U.S. patent application Ser. No. 09/297,097 entitled "High Efficiency Amplifier Output Level and Burst Control," incorporated herein by reference, could incur undesired distortions when using these types of transistors.

What would be desirable is to perform this type of modulation technique at reduced complexity and increased efficiency while substantially reducing the size and power of the modulation system.

SUMMARY OF THE INVENTION

It is an objective of this invention to provide for the generation of amplitude-varying passband signals using only amplifiers which are either non-linear or extremely non-linear (switch-mode).

It is an additional objective that the complexity of the dual-phase-modulated signal synthesis block of the Chireix or LINC methods be reduced.

It is another objective that this modulator implement the carrier phase reversals of an amplitude-modulated-only signal, without the need of phase modulator circuitry.

It is a further objective that the overall energy efficiency of this signal generator be high.

A still further objective is for this signal generator to not require more modulation bandwidth than that of the desired signal.

A still further objective is for this signal generator to not require large amounts of heat to be absorbed by the combiner block when the output signal is at low amplitude.

Furthermore, it is an objective of the present invention to assure that efficient non-linear amplifiers used in the modulation system always operate above the onset of any distortion occurring on low-level signals, while maintaining full control on the output signal for vanishingly small output levels.

In order to achieve these objectives, a system and method of dual channel amplitude modulation of a phase-modulated signal is described.

One embodiment of the system includes means for producing first and second phase modulated signals that are 180 degrees out of phase from each other. The system further includes a first non-linear amplifier and a second non-linear amplifier having an amplification factor much greater than the first non-linear amplifier. The first non-linear amplifier amplifies the first signal with constant amplification to generate an amplified first signal. The second non-linear amplifier amplifies the second phase modulated signal by performing varying amplification using an information signal to generate an amplitude modulated and amplified second signal. A signal combiner sums the output signals from the two non-linear amplifiers. Since the signals generated by the first and second non-linear amplifiers are 180 degrees out of phase from each other and since the first non-linear amplifier has an amplification factor that is significantly less than the amplification factor of the second non-linear amplifier, the output signal from the signal combiner is the larger modulated signal minus the smaller opposing signal. The resulting effect is that the signal generated by the first amplifier cancels out distortion at the lower amplitude levels in the second modulated signal thereby generating an amplitude modulated signal having reduced lower level distortion.

One embodiment of the method of amplitude modulating a phase modulated signal includes the steps of producing first and second phase modulated signals that are 180 degrees out-of-phase from each other. The first phase modulated signal is then amplified by a first smaller amplification factor using constant amplification to generate an amplified first signal. The second phase modulated signal is amplitude modulated and amplified using variable amplification by a second amplification factor to generate an amplitude modulated and amplified second signal. Next, the amplified first signal and the amplitude modulated and amplified second signal are summed to generate an amplitude modulated signal of the original phase modulated signal having reduced distortion at lower amplitude levels.

BRIEF DESCRIPTION OF THE DRAWINGS

The present invention may be further understood from the following written description in conjunction with the appended drawings. In the drawings.

DETAILED DESCRIPTION OF THE PREFERRED EMBODIMENTS

In the following description, numerous specific details are set forth, such as specific functional elements or system structures in order to provide a thorough understanding of the present invention. It will be apparent, however, to one skilled in the art that these specific details need not be employed to practice the present invention. In other instances, well known modulation system operation and theory have not been described in order to avoid unnecessarily obscuring the present invention.

Figure 2A:
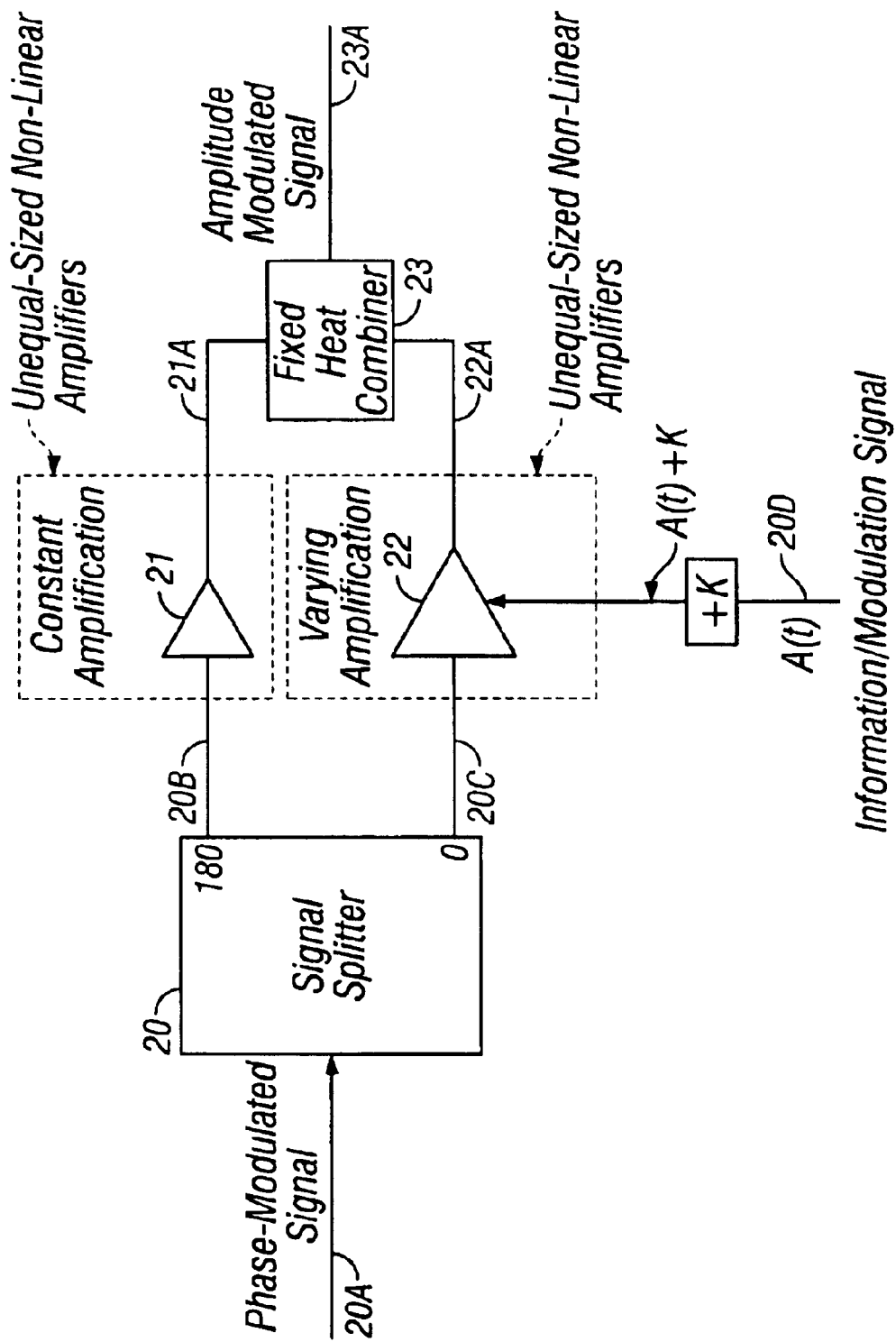
FIG. 2A shows one embodiment of a dual channel phase to amplitude modulation system of the present invention including unequal-sized power amplifiers which obtains amplitude modulation using a single power amplifier.
Figure 2B:
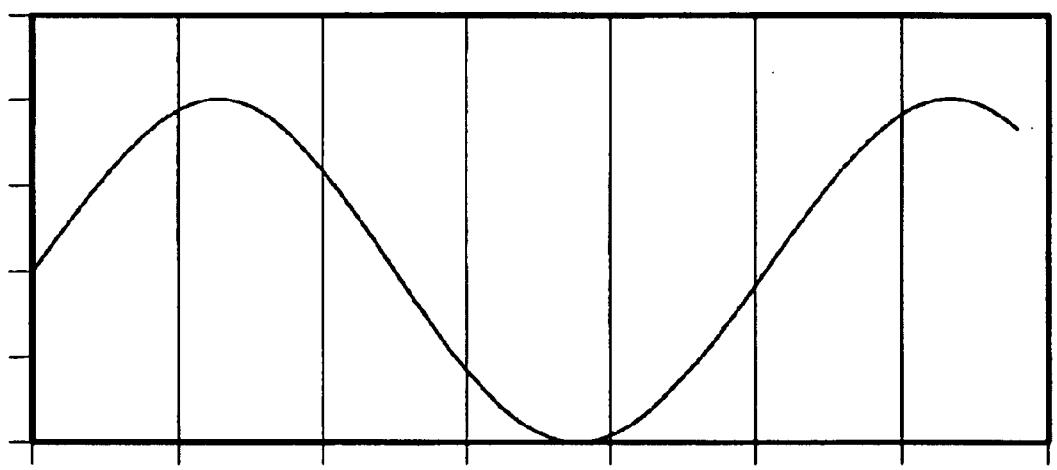
FIGS. 2B–2F show the graphical summation of channel signals in the system shown in FIG. 2A.
Figure 2C:
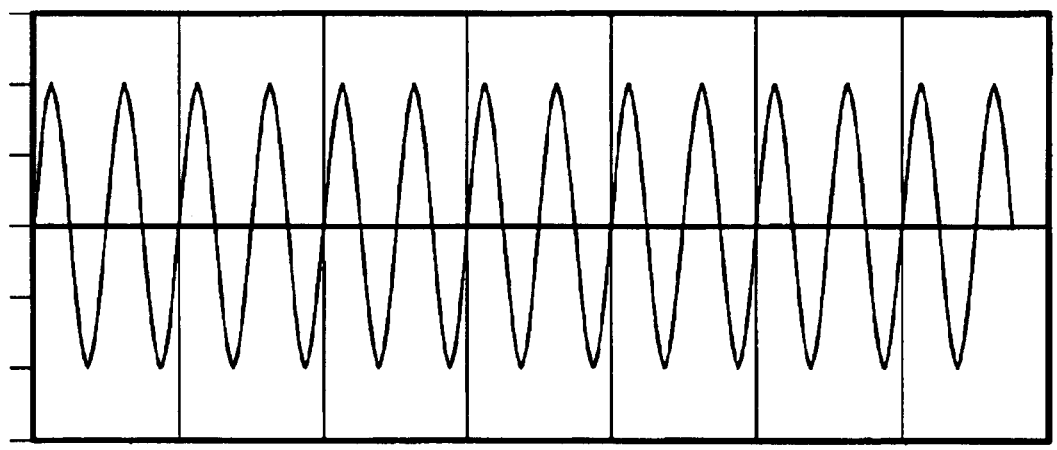
Figure 2D:
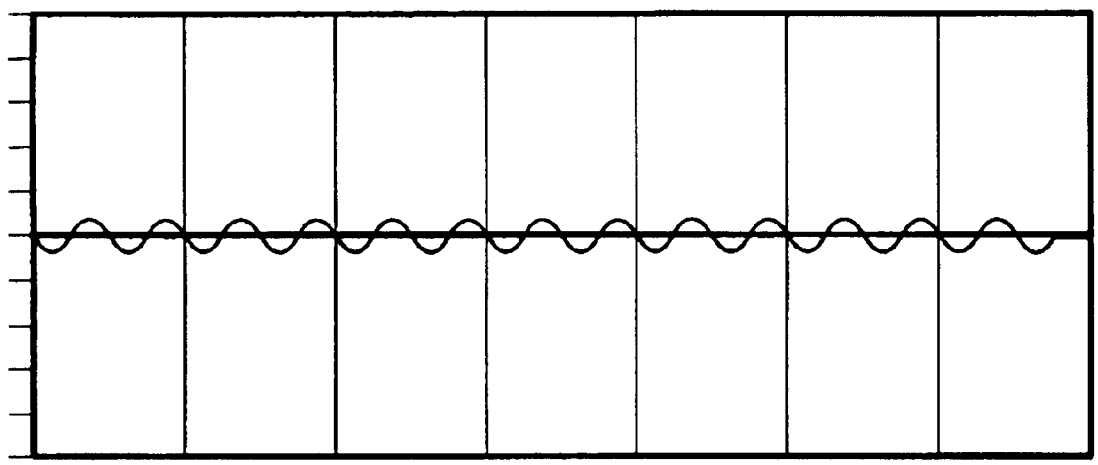
Figure 2E:
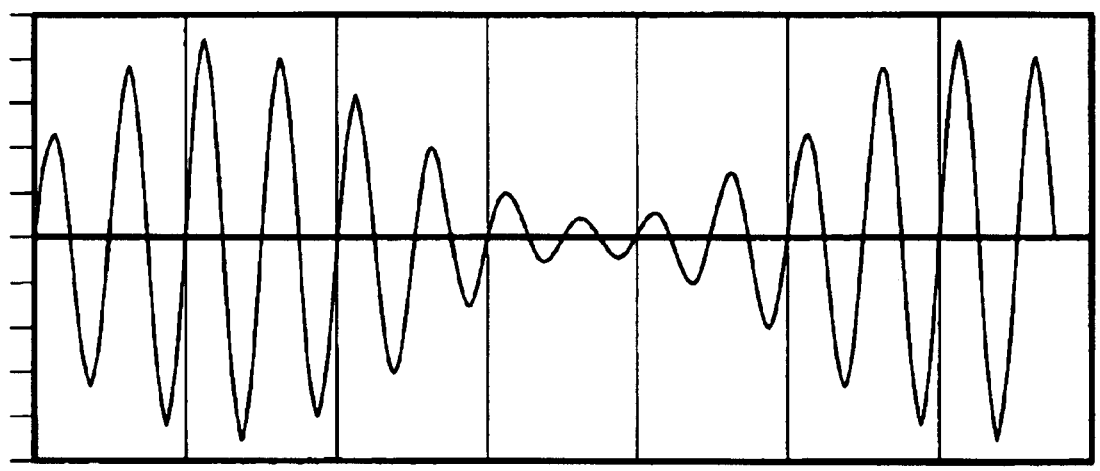
Figure 2F:
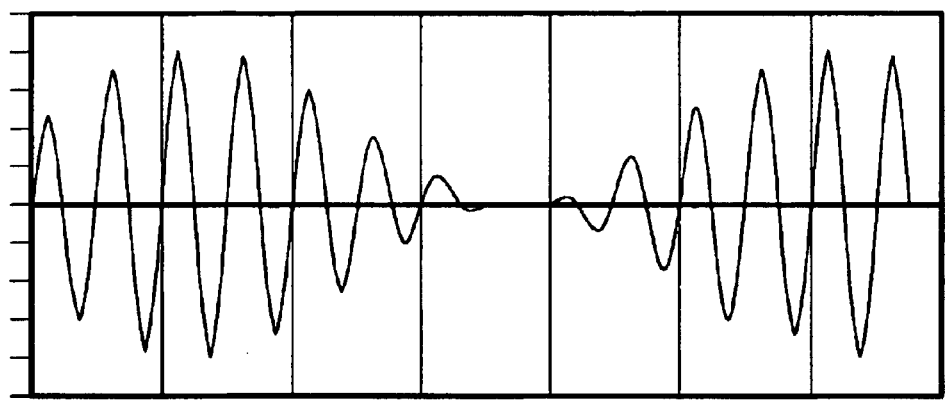

FIG. 2A shows one embodiment of a dual channel amplitude modulation system including unequal-sized power amplifiers which, in general, obtains amplitude modulation by using a larger power amplifier to amplitude modulate the phase modulated input signal using an information/modulation signal and by using a smaller amplifier to generate an out-of-phase cancellation signal which when combined with the amplitude modulated signal effectively cancels out low level distortion in the amplitude modulated signal generated by the larger power amplifier.

Referring to FIG. 2A, a phase information signal 20A is coupled to a first phase modulator 21 and to a phase correction unit 20 which generates a modified phase information signal 20B. The modified phase information signal 20B is applied to a second phase modulator 22. The phase correction unit 20 and first and second phase modulators 21 and 22 form a Phase Drive Processor 10.

The phase correction unit 20 performs the following tasks: 1. Adds 180 degrees to the phase input; 2. Corrects for the difference between the phase shift through power amplifier 23 and the phase shift through power amplifier 24. This difference is due in part to the different size and amplification factors of the power amplifiers and in part to AM/PM distortion. More particularly, the need for AM/PM compensation arises because, while one of the power amplifiers is not amplitude modulated, the other power amplifier is amplitude modulated and so will exhibit AM/PM distortion and a consequent amplitude-varying phase shift. As a result of the first action of the phase correction unit 20, the signal 22A is essentially the same as signal 21A except 180 degrees out-of-phase from it. In another embodiment, signal 22A can be out-of-phase from signal 21A by an odd multiple of 180 degrees, for instance, 540 degrees or 900 degrees out-of-phase. Signals 22A and 21A can be represented as follows:

Signal $22A = K_1 \cos(\omega_c t + \phi(t) + \pi) = -K_1 \cos(\omega_c t + \phi(t))$ Signal $21A = K_2 \cos(\omega_c t + \phi(t))$ (Note: for ease of further evaluation, $K_1 = K_2 = 1$).

Signal 21A is coupled to a first non-linear power amplifier 23 having a first amplification factor K. Amplifier 23 is biased to provide constant amplification of signal 21A. Hence, the output signal 23A of power amplifier 23 is a signal having the same phase and frequency of the input signal except amplified by the constant amplification factor of the power amplifier 23. Signal 23A can be expressed in the following manner:

$$\text{Signal } 23A = K \cos(\omega_c t + \phi(t))$$

Signal 22A is coupled to a second non-linear power amplifier 24 having a variable amplification factor controlled in accordance with A(t). Amplifier 24 is biased with a varying information/modulation signal 20D so as to amplitude modulate and amplify signal 22A. Hence, the output signal 24A of power amplifier 24 is a signal having the same phase and frequency of the input signal 22A but which has amplitude variations corresponding to the information signal 20D. It should be noted that the information signal 20D represents the desired amplitude A(t) of the output signal. Since polar modulation is used, the signal magnitude is always considered positive, that is, A(t)≧0. Hence, before application to control the magnitude of amplifier 24, an offset (i.e., K) is added to this signal which is equal to the magnitude K of the opposition signal 23A. Signal 24A can be expressed in the following manner:

$$\text{Signal } 22A = (A(t) + K) \cos(\omega_c t + \phi(t) + \pi)$$

It should also be noted that since signals 21A and 22A are 180 degrees out of phase from each other, signals 23A and 24A are out of phase by the same phase amount since no phase modulation is performed by amplifiers 23 and 24.

Signals 23A and 24A are coupled to signal combiner 25 which sums the two signals. Since the signals are essentially 180 degrees out-of-phase from each other, the two signals subtract. In other words, any positive swing excursion of signal 24A is reduced by an amount of the negative swing excursion of signal 23A and any negative swing excursion of signal 24A is reduced by an amount of the positive swing excursion of signal 23A. The summation of signals 23A and 24A is graphically shown in FIGS. 2B–2F.

As seen in FIGS. 2B–2F, since the relative amplification factor of amplifier 24 is much greater than that of amplifier 23, signal 23A generated by amplifier 23 is much smaller than signal 24A generated by amplifier 24. As a result, signal 23A has the effect of subtracting lower level signals in signal 24A thereby eliminating distortion typically exhibited at these lower levels due to the non-linear characteristics of power amplifier 24. Hence, in this embodiment, signal 23A is amplified sufficiently to cancel most lower level distortion exhibited in signal 24A.

In one embodiment the relative amplification factors of amplifiers 23 and 24 is determined by evaluating what percentage of output signal 24A represents amplification distortion at lower amplitude levels and hence what portion of signal 24A needs to be canceled out by signal 23A. For instance, if the determined percentage is N, then signal 23A would be amplified by a factor of N and signal 24A would be amplified by a factor of N plus the intended amplification factor. It should be noted that in this embodiment, a fixed magnitude output signal is obtained by ensuring the magnitudes of input signals 21A and 22A do not vary.

In one embodiment, amplifier 23 has an amplification factor that is in the range of 10% that of amplification factor of amplifier 24.

Figure 1A:
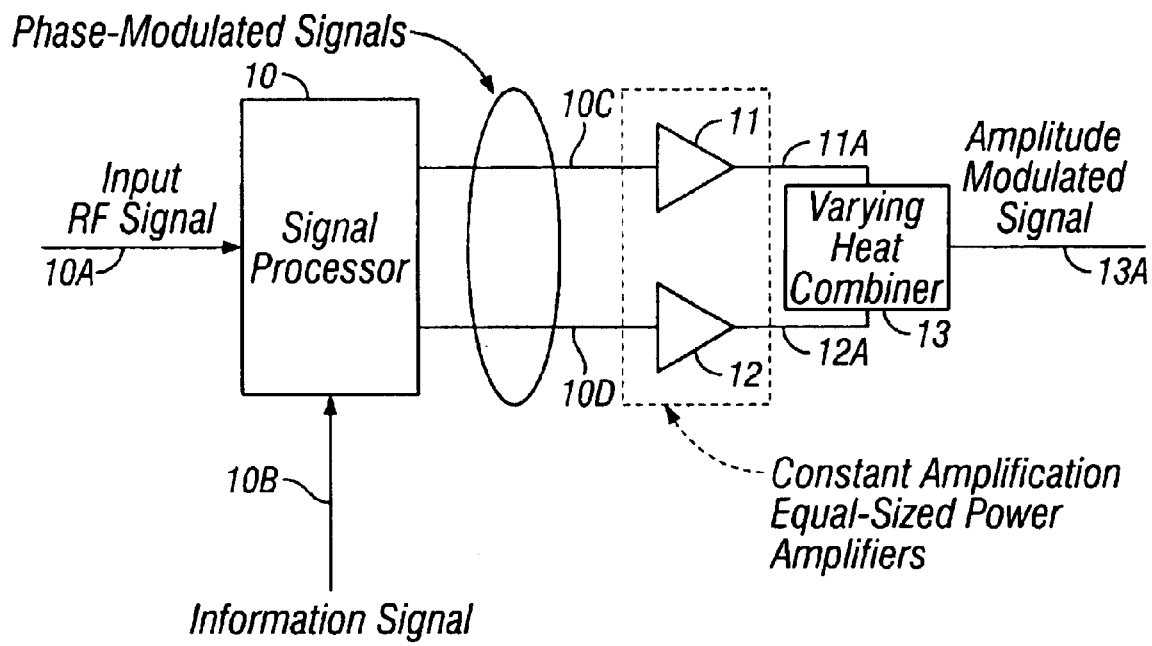
FIG. 1A shows a prior art dual channel phase to amplitude modulation system including two equal-sized power amplifiers which obtains amplitude modulation through summation of the relative phase modulated channel signals.
Figure 1B:
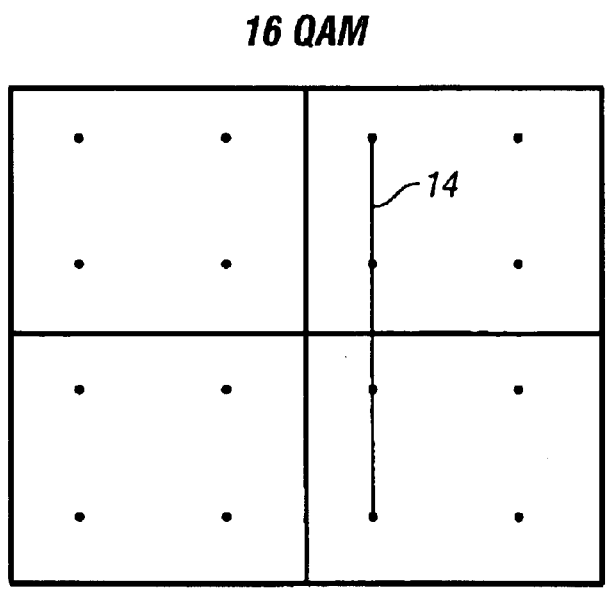
FIG. 1B shows a direct transition in a 16-point signal generated by the system shown in FIG. 1A.
Figure 1C:
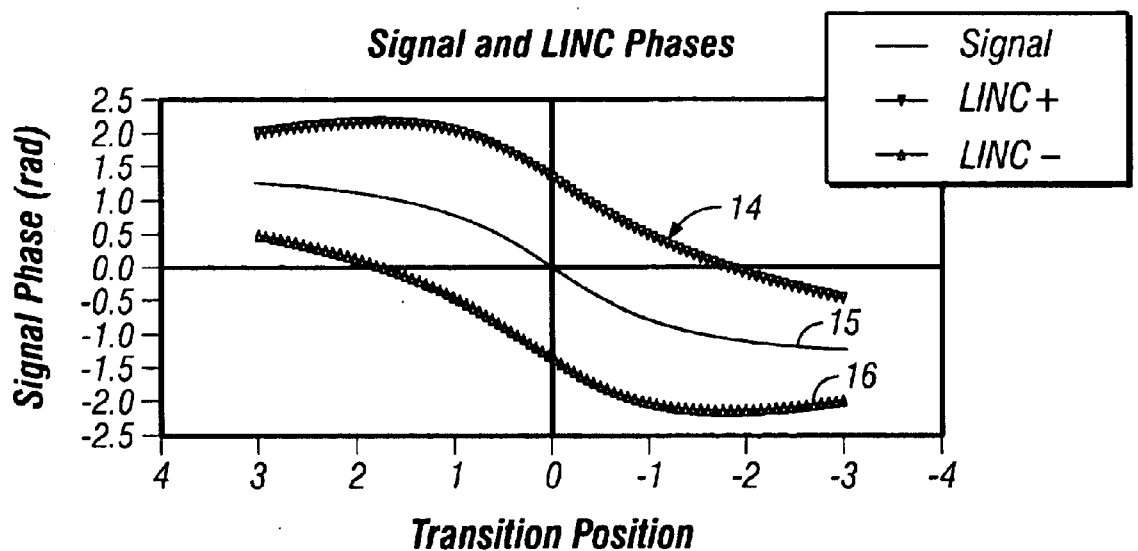
FIG. 1C shows the phase of the signal transition shown in FIG. 1B and corresponding channel signals.
Figure 1D:
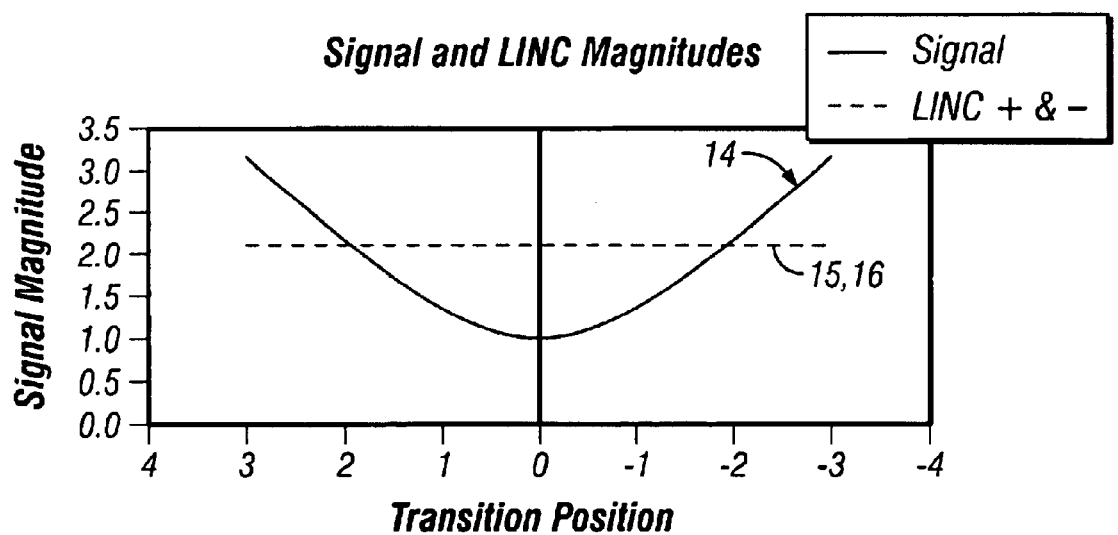
FIG. 1D shows the magnitude of the signal transition shown in FIG. 1B and corresponding channel signals.

One of the primary advantages of the modulation system shown in FIG. 2A (as compared to the prior art system of FIG. 1A, for example) is that only one large non-linear power amplifier is utilized, thereby reducing the space and power consumption of the power amplifier portion of the overall modulation system by approximately 50%. In addition, the modulation system provides an AM signal with reduced distortion at lower amplitude levels.

In one embodiment, power amplifiers 23 and 24 can be embodied as hardlimiters, or switch-mode devices, or any device that provides a fixed output level for varying input levels. In this case, the output signals 23A and 24A will have amplitudes set by these amplifiers, regardless of amplitude variations that may exist on the input signals. Such amplitude variations may occur from imbalances in the phase modulators 21 and 22, which are undesired.

In one embodiment, power amplifier 24 is modulated by varying the power level applied to the amplifier using information signal 20D. One example of such modulation is shown in U.S. patent application Ser. No. 09/247,097, incorporated herein by reference.

Figure 3A:
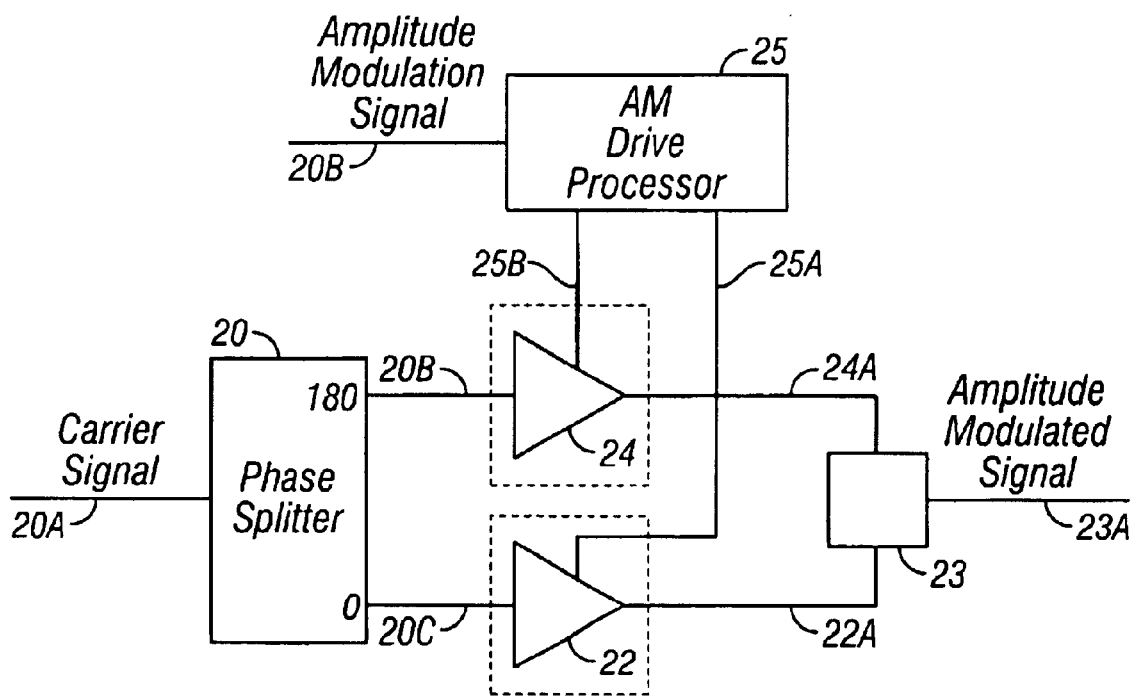
FIG. 3A shows a second embodiment of a dual channel modulation system of the present invention.
Figure 3B:
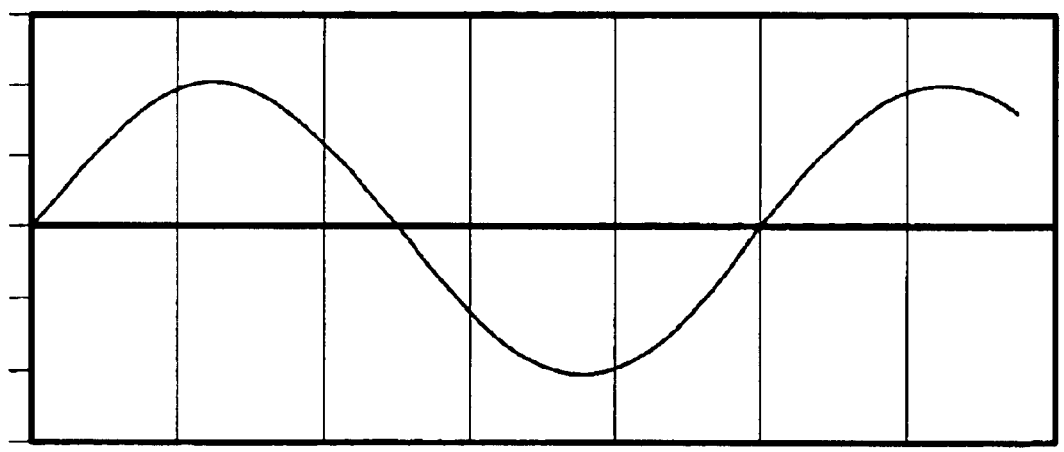
FIGS. 3B–3F show individual signals within the modulation system shown in FIG. 3A.
Figure 3C:
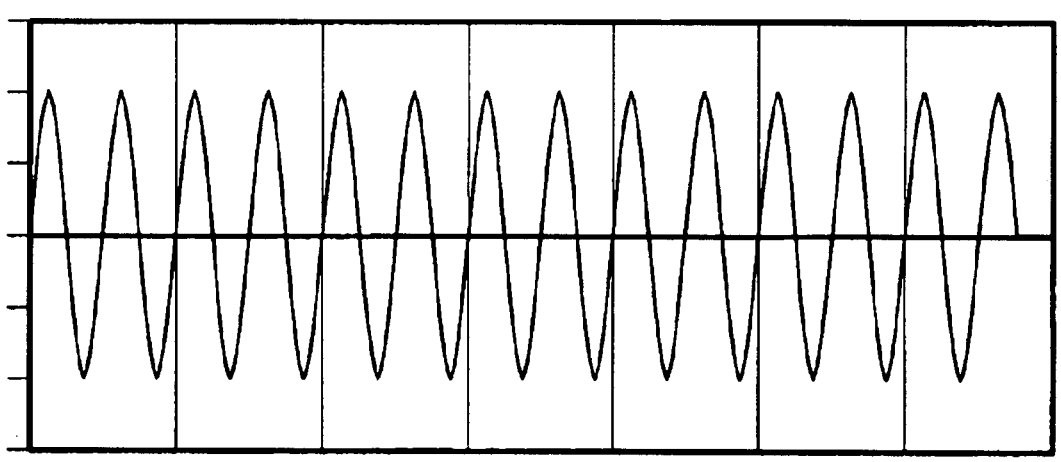
Figure 3D:
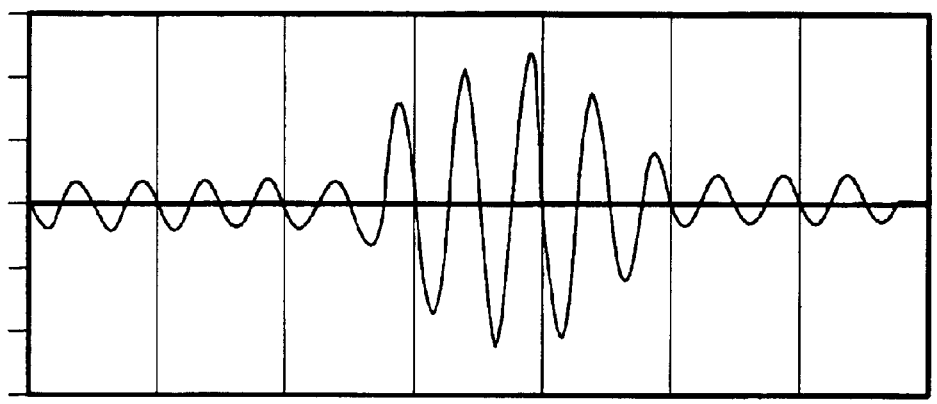
Figure 3E:
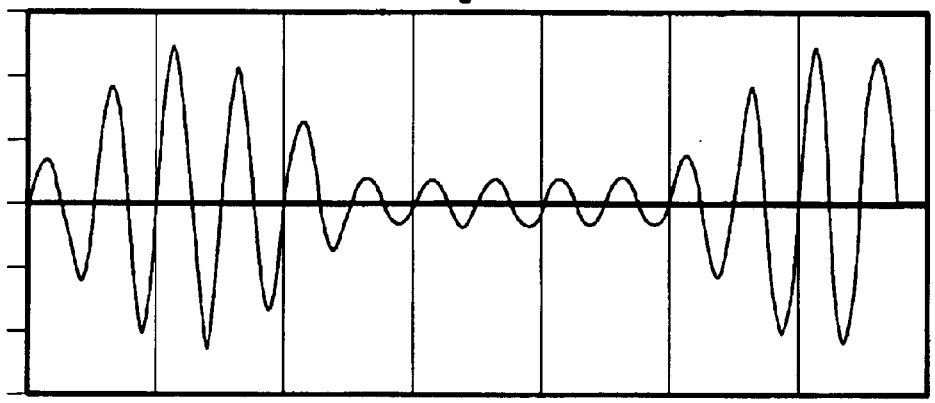
Figure 3F:
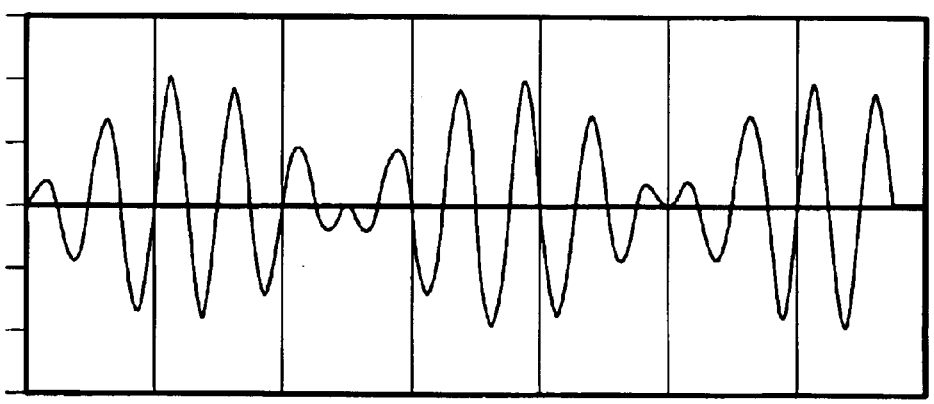

Another embodiment is illustrated in FIG. 3A, in which like elements as those of FIG. 2A are identified by like reference numerals. Instead of unequal amplifiers, equal-sized amplifiers 24 and 28 are provided. An AM Drive Processor 26 is responsive to the amplitude modulation signal 20D to produce AM drive signals 26A and 26B for amplifiers 24 and 28, respectively. In this embodiment, the output signals only have amplitude modulation, it is convenient to change the understanding of the phase modulation and amplitude modulation inputs. Specifically, the amplitude modulation is now understood to take on both positive and negative values. While the amplitude modulation has a negative value, the phase modulation effects a reversal (180-degree phase shift). In this embodiment, the modulation system becomes a symmetrical structure as shown in FIG. 3A. In this case, there may be no applied phase modulation, in which case the Phase Drive Processor 10' would include only the phase correction unit 20. Instead of explicitly applying phase modulation, a required phase reversal on the output signal may be realized by increasing the amplitude of the heretofore opposing signal 28A while now holding signal 24A at the fixed magnitude K. Thus, the roles of the two signals are now reversed, which effects the desired phase reversal in the output signal. This is graphically illustrated in FIGS. 3B–3F. It should be noted that this embodiment also applies for output signals having phase modulation where negative amplitudes eliminate the need for phase modulation 180 degree shifts.

Figure 1E:
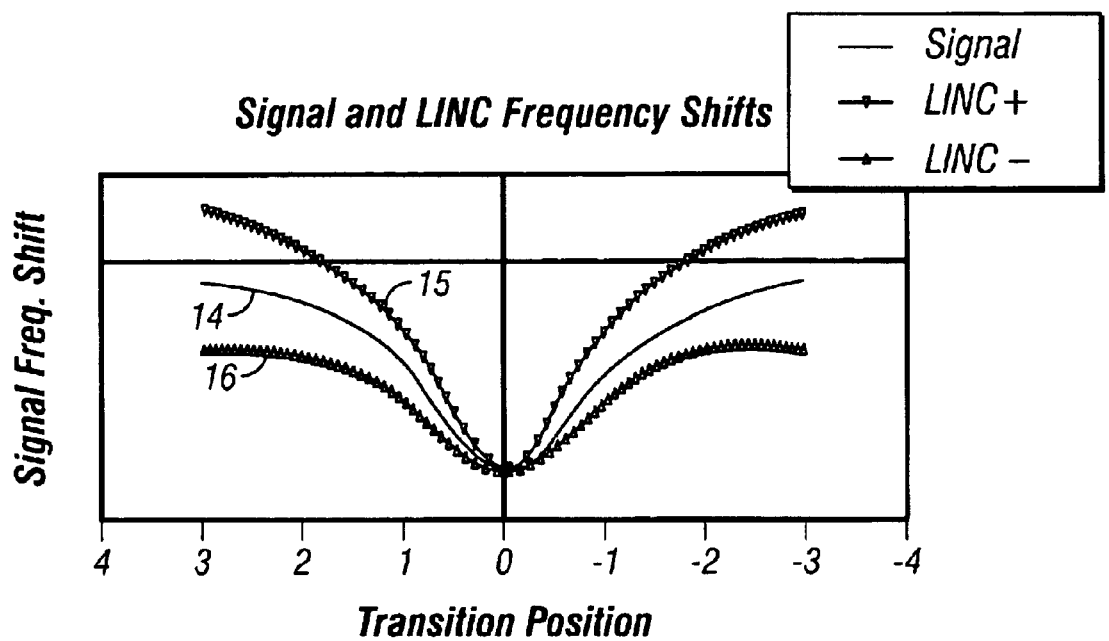
FIG. 1E shows the bandwidth of the modulator shown in FIG. 1A.
Figure 1F:
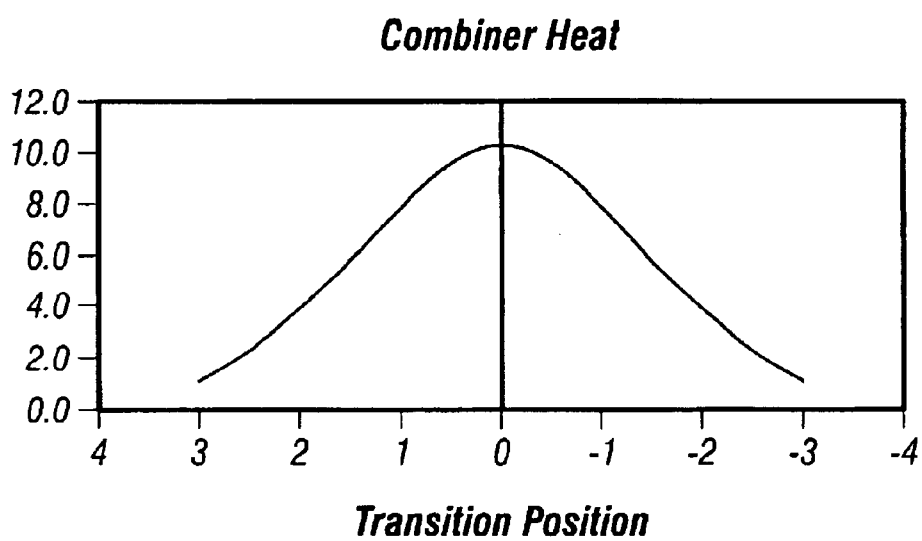
FIG. 1F shows the combiner (block 13) heat absorption during the signal transition shown in FIG. 1B.
Figure 4A:
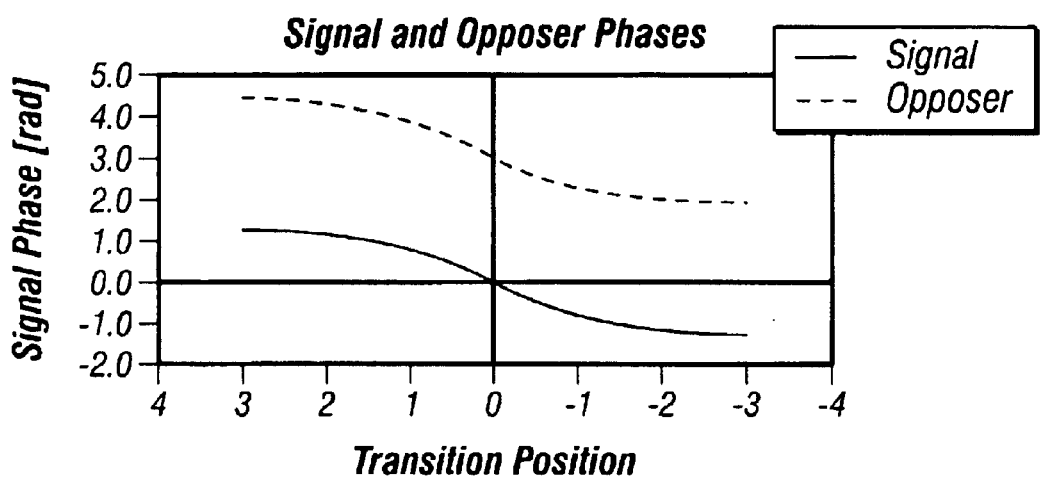
FIGS. 4A–4D show graphical performance characteristics of the second embodiment of the modulation system of the present invention shown in FIG. 2B.
Figure 4B:
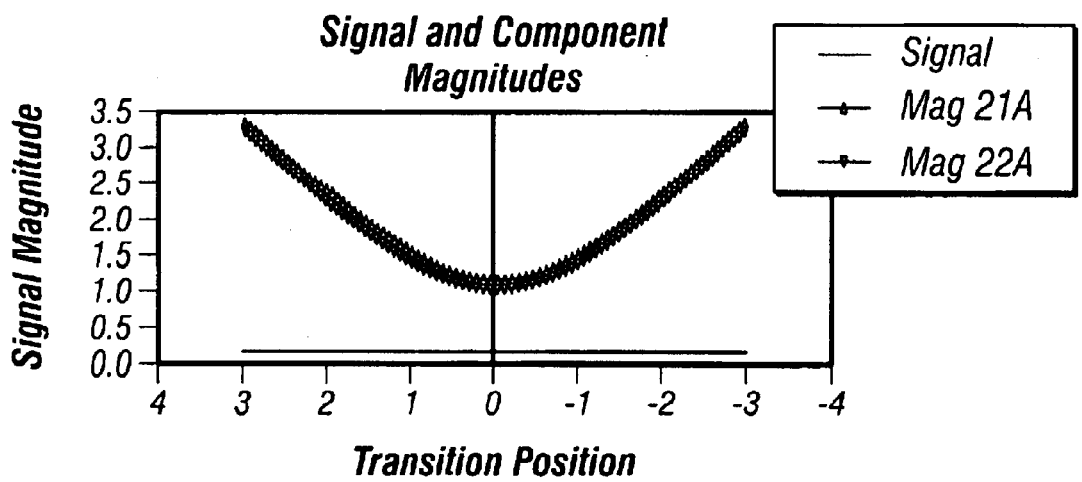
Figure 4C:
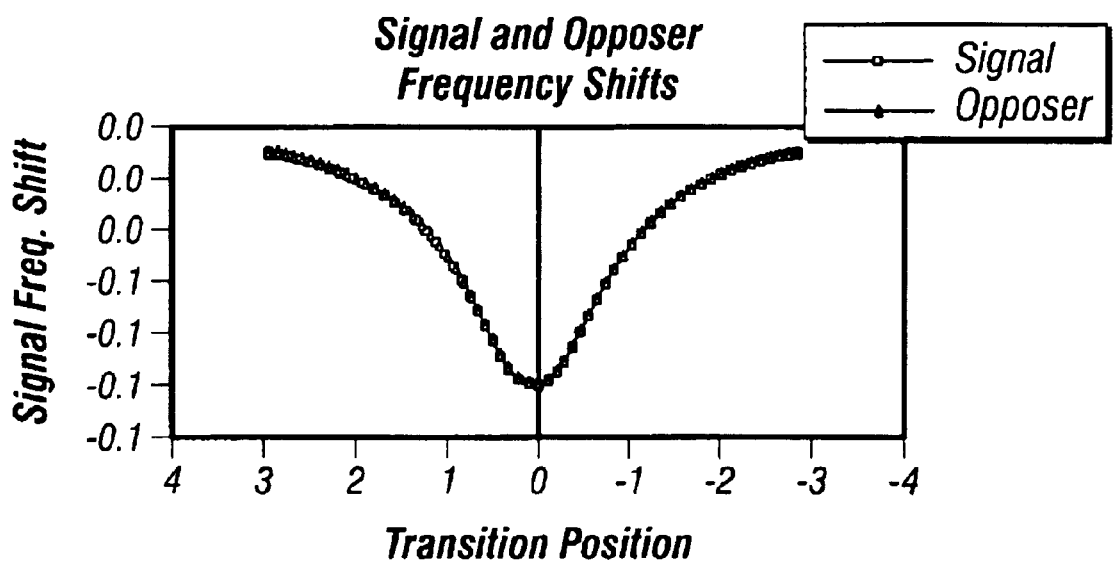
Figure 4D:
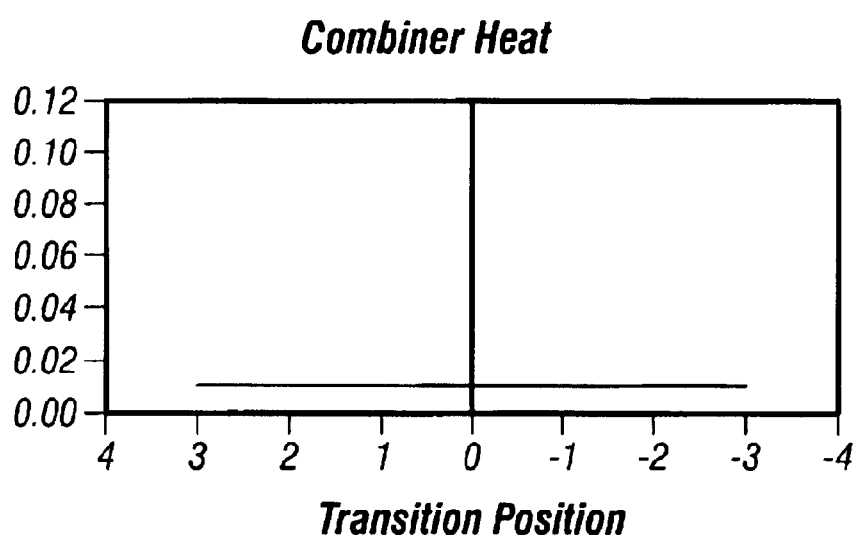

FIGS. 4A–4D show graphical performance characteristics of the embodiment of the present invention shown in FIG. 3A. Comparing the prior-art performance characteristics shown in FIGS. 1B–1F to those of FIGS. 4A–4D, it can be seen from FIG. 4A there is only a fixed phase shift of 180 degrees (pi radians) plus a typically small AM/PM correction, so the objective of simplifying the phase modulators is clearly seen when compared to signals 10C and 10D and FIG. 1A. In addition, there are now two separate amplitudes, as shown in FIG. 4B, which are controlled with high precision and high efficiency as described above. Moreover, with no additional phase modulation needed, the modulation bandwidth requirements of the present invention (shown in FIG. 4C) are identical to that of the original signal unlike the modulation bandwidth requirements (FIG. 1E) of the prior-art system. Most strikingly, the heat absorbed (and dissipated) by the combiner is dramatically reduced as seen by comparing FIG. 4D to the original heat absorption from FIG. 1F. The entire vertical scale of FIG. 4D is only the lowest 1% of that of FIG. 1F, so the heat absorbed by the combiner for the present invention is effectively 1/1000 of that of the prior art.

Figure 5A:
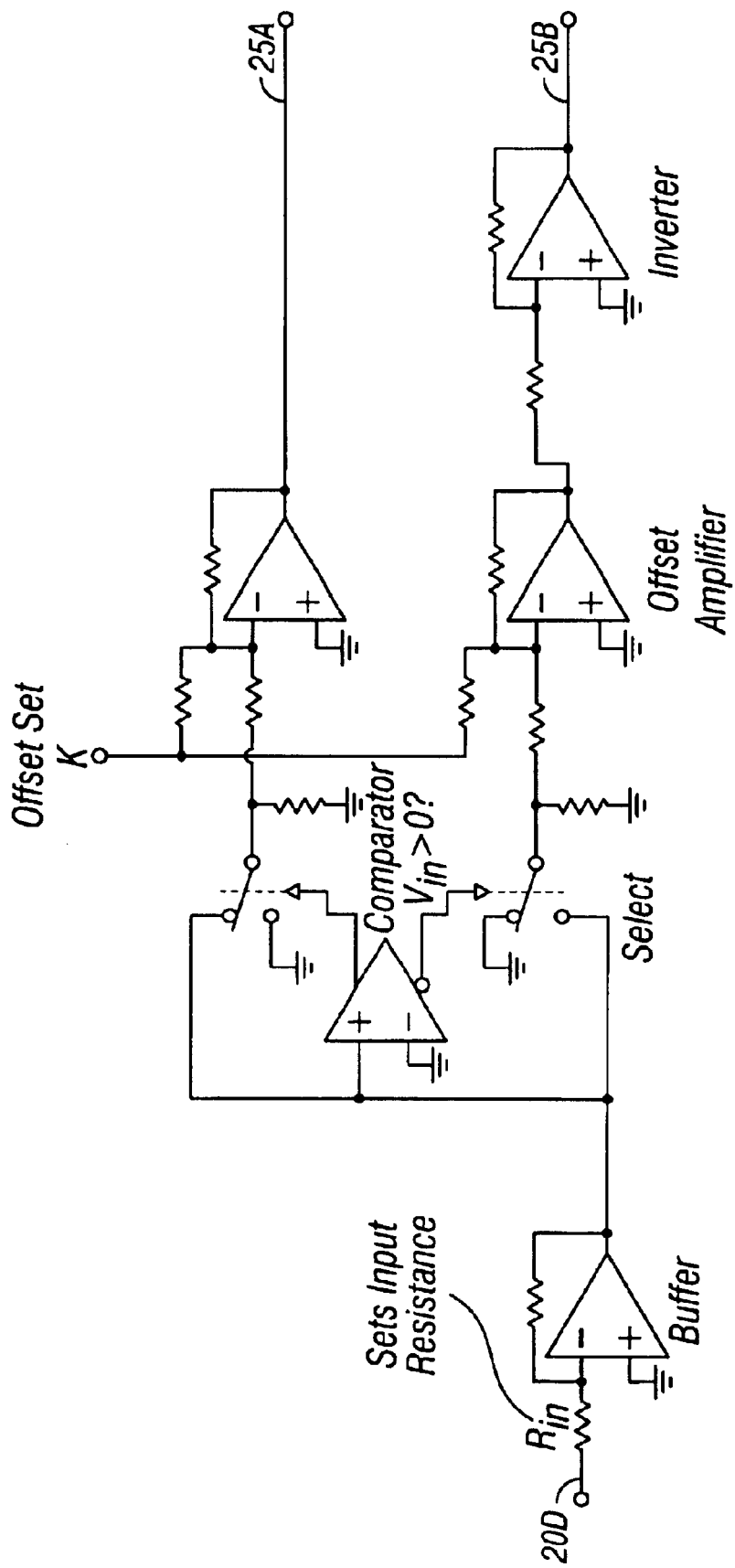
FIG. 5A shows one embodiment of the AM Drive Processor implemented within the modulation system shown in FIG. 3A.
Figure 5B:
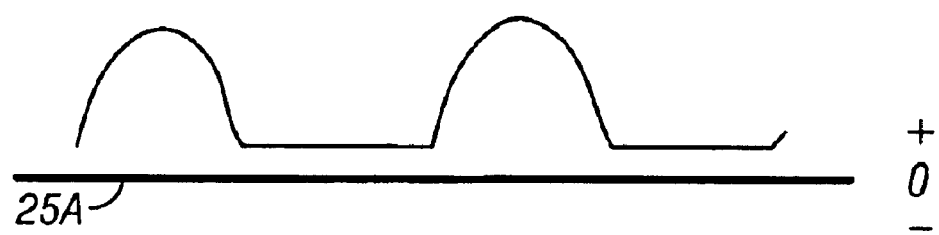
FIGS. 5B and 5C show the drive signal generated by the AM Drive Processor shown in FIG. 5A.
Figure 5C:
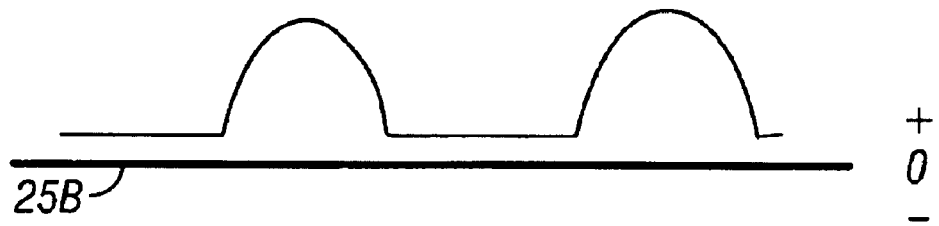

FIG. 5A shows one embodiment of AM Drive Processor 26 having three stages: a buffer stage 1, a select stage 2, and a Off-set stage 3. The buffer stage 1 sets an input impedance and also provides isolation between the input 20D and stage 2. The select stage 2 selects which signal path the input is routed to, dependent on whether the instantaneous value of the input signal is greater than, or less than zero. If the input is greater than or equal to zero, then the 26A signal path is selected and if the input is less than zero then the 26B path is selected. The switches 27A and 27B are opposing such that as one passes the input signal, the other connects to ground. The offset stage 3 adds the offset K to the selected input signal, that is, if the selected input is ground, then the output is equal to the offset K, and if the input is the signal, then the output is K plus that signal. In addition, output 26B inverts the input signal before adding the offset K.

Figure 6:
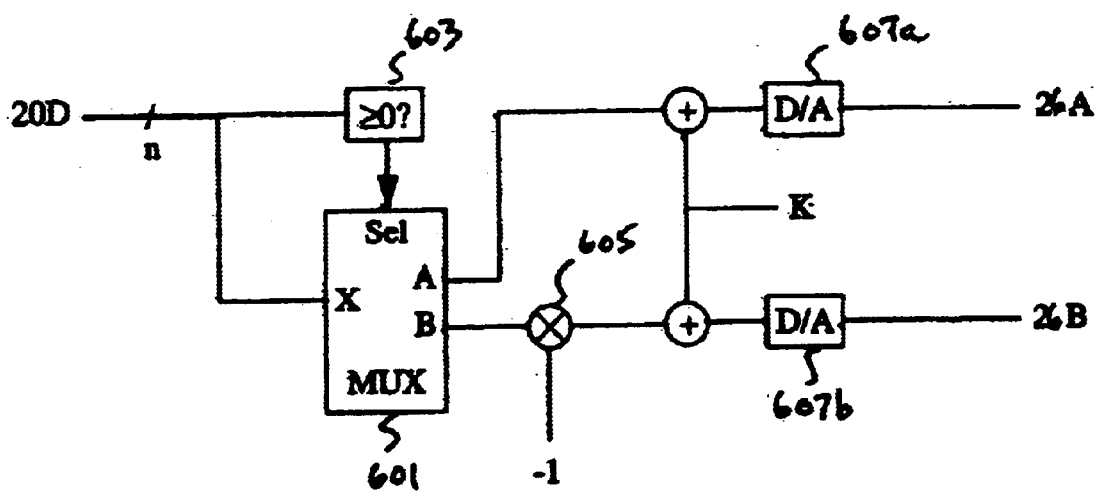
FIG. 6 shows another embodiment of the AM Drive Processor.

One digital embodiment of the AM drive processor is shown in FIG. 6. In this example, the digital word 20D is considered to be coded using signed (e.g., twos-complement) notation. This input digital word is applied simultaneously to a multiplexer 601 and a digital comparator 603. The multiplexer 601 has two outputs, one of which (output A) is not subject to sign inversion and another of which (output B) is subject to sign inversion by operation of a multiplier or sign inversion circuit 605. The select input of the multiplexer is driven by the digital comparator, where MUX output A is selected to be active if the digital word is non-negative and MUX output B is selected if the digital word is negative. As in the previously-described embodiment, an offset K is added to both resulting signals, which are converted by D/A converters 607a and 607b to produce output signals 26A and 26B.

Although the components of the present invention have been described in conjunction with certain embodiments, it is appreciated that the invention can be implemented in a variety of other ways. Consequently, it is to be understood that the particular embodiments shown and described by way of illustration are in no way intended to be considered limiting. Reference to the details of these embodiments is not intended to limit the scope of the claims which themselves recite only those features regarded as essential to the invention.

What is claimed is:

1. A system for amplitude modulating a phase modulated signal with an information signal, said system having an associated intended amplification factor, said system comprising:
   means for producing a first phase modulated signal and a second phase modulated signal that is phase shifted from the first phase modulated signal;
   a first non-linear amplifier having a first amplification factor for amplifying said first phase modulated signal by providing an amplification of said first phase modulated signal to generate an amplified first signal;
   a second non-linear amplifier having a second amplification factor greater than or equal to said first amplification factor, said second non-linear amplifier modulating said second phase modulated signal by providing varying amplification using said information signal to generate an amplitude modulated second signal;
   a signal combiner for summing said amplified first signal and said amplitude modulated second signal to generate an amplitude modulated signal of said phase modulated signal.

2. The system as described in claim 1 wherein said first amplification factor is N and said second amplification factor is N plus said intended amplification factor.

3. The system as described in claim 1 wherein said amplification factor N is about 10% of said intended amplification factor.

4. The system as described in claim 1 wherein said phase modulated signal is a radio frequency signal.

5. The system as described in claim 1 wherein said second phase modulated signal is modulated with said second non-linear amplifier by varying bias to said second non-linear amplifier output terminal using said information signal.

6. The system as described in claim 1 wherein said second phase modulated signal is phase shifted from said first phase modulated signal by a fixed phase shift amount.

7. The system as described in claim 1 wherein said second phase modulated signal is phase shifted from said first phase modulated signal by a phase shift amount in the range of 180 degrees.

8. The system as described in claim 1 wherein unintended amplitude variations are avoided by operating said first and second non-linear amplifiers in switched mode.

9. The system as described in claim 1 wherein unintended amplitude variations are avoided by ensuring said first and second phase modulated signals have constant amplitude.

10. The system as described in claim 1 wherein said first and second non-linear amplifiers are characterized in that they provide a constant amplitude output signal for a varying amplitude input signal.

11. The system as described in claim 10 wherein said first and second non-linear amplifiers are hardlimiter amplifier devices.

12. The system as described in claim 10 wherein said first and second non-linear amplifiers are switch mode amplifier devices.

13. A method of amplitude modulating a phase modulated signal comprising:
    producing a first phase modulated signal and a second phase modulated signal that is phase shifted from said first phase modulated signal;
    amplifying said first phase modulated signal by a first amplification factor to generate a first amplified signal;
    modulating said second phase modulated signal using variable amplification by a second amplification factor to generate a second amplitude modulated signal, said second amplification factor being greater than said first amplification factor; and
    summing said first amplified signal and said second amplitude modulated signal to generate an amplitude modulated signal of said phase modulated signal.

14. The method as described in claim 13 wherein said step of amplifying said first phase modulated signal further comprises amplifying said first phase modulated signal by an amplification factor of N and said step of modulating said second phase modulated signal further comprises the step of modulating said second phase modulated signal using an amplification factor of N plus an intended amplification factor.

15. The method as described in claim 13 wherein said amplification factor N is about 10% of said intended amplification factor.

16. The method as described in claim 13 wherein said phase modulated signal is a radio frequency signal.

17. The method as described in claim 13 wherein said step of amplifying and said step of modulating is performed utilizing first and second non-linear amplifiers, respectively.

18. The method as described in claim 13 wherein unintended amplitude variations are avoided by operating said first and second non-linear amplifiers in switched mode.

19. The method as described in claim 13 wherein unintended amplitude variations are avoided by ensuring said first and second phase modulated signals have constant amplitude.

20. The method as described in claim 13 wherein said step of producing a first phase modulated signal and a second phase modulated signal further comprising phase shifting said first phase modulated signal and second phase modulated signal by an odd multiple of 180 degrees.

21. A method of generating a phase modulated signal having a phase discontinuity, comprising:

generating an in-phase carrier signal and an antiphase carrier signal;

generating a modulation signal that exhibits positive and negative excursions about a midpoint;

amplifying the carrier signal to produce amplified signals, including:

during an interval during which the modulation signal exhibits a positive excursion, applying greater amplification to the in-phase carrier signal than to the antiphase carrier signal; and during an interval during which the modulation signal exhibits a negative excursion, applying greater amplification to the antiphase carrier signal than to the in-phase carrier signal;

wherein an amplified signal experiencing greatest amplification incorporates an offset level, and an amplified signal experiencing least amplification is of a level substantially equal to said offset level; and combining the amplified signals to produce said phase modulated signal.

22. An amplifier apparatus comprising:

means responsive to a carrier signal for generating an in-phase carrier signal and an antiphase carrier signal;

one amplifier device for amplifying the in-phase carrier signal to produce one amplified signal;

another amplifier device for amplifying the antiphase carrier signal to produce another amplified signal, the one amplifier and the other amplifier being substantially commensurate in amplification capability;

a combiner for combining the one amplified signal and the other amplified signal; and a control circuit, responsive to a modulation signal that exhibits positive and negative excursions about a midpoint, for controlling the one amplifier device and the other amplifier device such that:

during an interval during which the modulation signal exhibits a positive excursion, greater amplification is applied to the in-phase carrier signal than to the antiphase carrier signal;

during an interval during which the modulation signal exhibits a negative excursion, greater amplification is applied to the antiphase carrier signal than to the in-phase carrier signal; and an amplified signal experiencing greatest amplification incorporates an offset level, and an amplified signal experience least amplification is of a level substantially equal to said offset level.

23. The apparatus of claim 22, wherein said control circuit comprises:

an input signal path;

a comparator coupled to the input signal path for performing a threshold comparison on an input signal and producing a comparison result;

one output signal path comprising a selector responsive to the comparision result for selecting one of the input signal and a reference level, and circuitry for adding an offset level to the selected one to produce one output signal applied to the one amplifier device; and another output signal path comprising a selector responsive to the comparision result for selecting one of the input signal and a reference level, an inverter for inverting the selected one to produce an inverted selected signal, and circuitry for adding an offset level to the inverted selected signal to produce another output signal applied to the other amplifier device.

* * * * *